United States Patent Office 3,738,862

Patented June 12, 1973

3,738,862

PROCESS FOR PREPARING REINFORCED LAMINATES IN SITU WITH EPOXY-POLYHYDRIC PHENOL CONDENSATES

John M. Klarquist, Paul D. Jones, and Lawrence C. Reilly, Cherry Hill, N.J., assignors to Shell Oil Company, New York, N.Y.

No Drawing. Original application Feb. 24, 1970, Ser. No. 13,786, now abandoned. Divided and this application Nov. 8, 1971, Ser. No. 198,023

Int. Cl. C08g *30/14*

U.S. Cl. 117—126 GE 11 Claims

ABSTRACT OF THE DISCLOSURE

Laminates, particularly glass reinforced electrical laminates, are prepared in situ by impregnating a glass cloth with a varnish comprising (1) an epoxy resin containing an organic phosphine or a phosphonium halide, (2) a phenol, (3) a solvent, (4) an epoxy curing agent, and optionally (5) an accelerator.

This is a division, of application Ser. No. 13,786, filed Feb. 24, 1970, now abandoned.

BACKGROUND OF THE INVENTION

Glass laminates have been prepared using epoxy resin binders; however, the preparation of such resin binders requires a costly kettling operation for each epoxy resin used. In other words, for every epoxy resin used it was necessary to "tailor-make" or "custom-make" each resin in a separate kettle using different formulations and techniques. This procedure is obviously expensive. It is therefore extremely desirable to have a less expensive, more versatile process which will allow the laminator to "custom-make" a multitude of grades and qualities of epoxy resin laminates from a single base resin system. It is also very desirable to have a process which permits the laminator to easily make periodic changes in composition of the laminating resin as needed to optimize performance and/or cost of the finished laminates.

It has now been found, quite surprisingly, that epoxy resin laminates can be economically and quickly made, in situ, in several grades from a single liquid grade epoxy resin. It has also been found that the hot strength of the "in situ" laminates is superior to the hot strength of laminates prepared from conventional kettled epoxy resin binders.

SUMMARY OF THE INVENTION

The present invention is particularly directed to a process for preparing epoxy resin laminates, particularly glass reinforced electrical laminates, in situ which comprises (A) Impregnating a conventional, untreated or pretreated, glass cloth, web, weave, fabric or the like with a laminating varnish comprising
  (1) an epoxy resin, preferably a liquid epoxy resin having more than one 1,2-epoxide group containing an organic phosphine or a phosphonium halide,
  (2) a polyhydric phenol,
  (3) a solvent, preferably an organic solvent,
  (4) an epoxy curing agent, and optionally, an accelerator;

(B) Advancing the resin impregnated glass laminate (wet prepreg) according to conventional schedules of time and temperature; and (C) Curing the advanced prepreg by conventional techniques, pressures, temperatures, cure cycles and the like.

It will be appreciated that steps (B) and (C) are merely noted herein as being conventional steps for preparing laminates and that the present invention lies in step (A) wherein a special epoxy resin composition is prepared in situ by impregnating a glass cloth with said special epoxy binder system. It is also abundantly clear that the present in situ laminating process allows the laminator to custom-make numerous grades of epoxy resin laminates from a single base resin, i.e., a liquid epoxy resin containing a minor amount of an organic phosphonium halide or organic phosphine.

DESCRIPTION OF THE PREFERRED EMBODIMENT

As stated hereinbefore, the essential feature of the present in situ laminating process is in the use of a special epoxy resin binder system.

Simply, the special resin binder composition comprises (1) From 10 to 90 parts by weight and preferably from about 25 to 75 parts by weight of polyepoxide composition comprising an epoxy compound having more than one 1,2-epoxy group, and preferably a liquid glycidyl polyether of a polyhdric phenol, and from about 0.001 to about 10% by weight based on the epoxy compound of an organic phosphine or an organic phosphonium halide;

(2) From 90 to 10 parts by weight and preferably 25 to 75 parts by weight of a phenol (a phenol possessing at least one, and preferably two or more phenolic OH groups) such as bisphenol A;

(3) A solvent, and preferably an organic solvent, although water, or mixtures of water with an organic solvent may be employed under some circumstances;

(4) An epoxy curing agent, preferably in curing amounts, such as the polybasic acids and anhydrides, amino-containing compounds, Lewis acids, Friedel-Crafts metal salts, polyamides, melamine reaction products containing methylol substituents and the like; and, optionally, (5) A catalyst or accelerator.

POLYEPOXIDE COMPOSITIONS

It has been found to be very desirable to utilize a "precatalyzed" polyeoxide composition comprising an epoxy compound having more than one 1,2-epoxide group and a minor amount, e.g., from about 0.001 to 10%, and more preferably from about 0.05 to about 5% by weight of at least one organic phosponium halide or at least one organic phosphine or a mixture thereof.

Epoxy compounds

The epoxy compounds which may be used are those possessing at least one 1,2-epoxide group, i.e., a

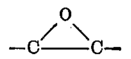

group. They may be monoepoxides or polyepoxides. The monoepoxides may be aliphatic or cycloaliphatic or heterocyclic and may be saturated or unsaturated. They may also be substituted with aromatic rings, ether groups, halogen atoms, ester groups, and the like. Examples of the monoepoxides include, among others, styrene oxide, phenyl glycidyl ether, allyl glycidyl ether, octadecyl glycidyl ether, amyl glycidyl ether, tolyl glycidyl ether, chlorophenyl glycidyl ether, naphthyl glycidyl ether, diacetate of monoglycidyl ether of glycerol, dipropionate of the monoglycidyl ether of glycerol, diacrylate of the monoglycidyl ether of glycerol, 1,2-hexylene oxide, ethylene oxide, propylene oxide, 1-heptylene oxide, 3-ethyl-1,2-pentylene oxide, glycidyl acetate, glycidyl benzoate, glycidyl propionate, glycidyl acrylate, glycidyl allyl phthalate, glycidyl methyl maleate, glycidyl stearate, glycidyl deate, methyl 1,2-epoxypropionate, butyl 1,2-epoxy propionate, and the like.

Preferred monoepoxides to be used include the monoepoxy-substituted hydrocarbons, such as, for example, the alkylene oxides containing up to 12 carbon atoms, the epoxy-substituted cycloaliphatic and aromatic hydrocarbons as epoxy cyclohexane, epoxypropylbenzene, and the like; the monoepoxy substituted alkyl ethers of hydrocarbon monohydric alcohols or phenols, such as, for example, the glycidyl ethers of aliphatic, cycloaliphatic and aromatic hydrocarbon alcohols containing up to 12 carbon atoms; the monoepoxy-substituted alkyl esters of hydrocarbon monocarboxylic acids, such as, for example, the glycidyl esters of aliphatic, cycloaliphatic and aromatic hydrocarbon acids, as glycidyl acrylate, glycidyl caprolate, glycidyl benzoate, and the like; the monoepoxy-substituted alkyl esters of hydrocarbon polycarboxylic acids wherein the other carboxyl group or groups are esterified with alkanols, such as, for example, glycidyl esters of phthalic acid, maleic acid, isophthalic acid, succinic acid and the like, wherein each contains up to 15 carbon atoms; alkyl and alkenyl esters of epoxy-substituted monocarboxylic acids, such as esters of 1,2-epoxypropionic acid, epoxy butyric acid and epoxy pentanoic acid; epoxyalkyl ethers of polyhydric alcohols wherein the other OH groups are esterified or etherified with hydrocarbon acids or alcohols, such as, for example, monoglycidyl ethers of aliphatic, cycloaliphatic polyhydric alcohols and polyhydric phenols, each containing no more than 15 carbon atoms; and monoesters of polyhydric alcohols and epoxy monocarboxylic acids wherein the other OH groups are esterified or etherified with hydrocarbon acids or alcohols, each containing no more than 15 carbon atoms.

Coming under special consideration, particularly because of the superior properties of the resulting hydroxy-substituted products are those monoepoxides which contain halogen atoms, and especially a plurality of chlorine atoms, such as epichlorohydrin, pentachlorophenyl glycidyl ether, hexachlorocyclohexyl glycidyl ether and the like.

Especially preferred are monoepoxides of the formula

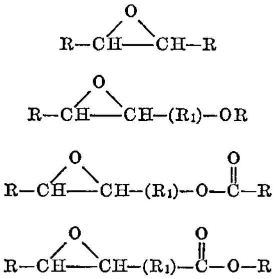

wherein R is hydrogen, a hydrocarbon or halogenated hydrocarbon radical and $R_1$ is a bivalent hydrocarbon or halogenated bivalent hydrocarbon radical, preferably containing 1 to 12 carbon atoms.

The polyepoxides used in the process of the invention comprise those compounds possessing more than one 1,2-epoxide group. These polyepoxides may be saturated or unsaturated, aliphatic, cycloaliphatic, aromatic or heterocyclic and may be substituted if desired with non-interfering substituents, such as halogen atoms, phosphorus atoms, hydroxyl groups, ether radicals, and the like. They may also be monomeric or polymeric.

For clarity, many of the polyepoxides and particularly those of the polymeric type are described in terms of epoxy equivalent values. The meaning of this expression is described in U.S. 2,633,458. The polyepoxides used in the present process are those having an epoxy equivalency greater than 1.0.

Various examples of polyepoxides that may be used in the invention are given in U.S. 2,633,458 and it is to be understood that so much of the disclosure of that patent relative to examples of polyepoxides is incorporated by reference into this specification.

Other examples include the glycidyl ethers of novolac resins, i.e., phenol-aldehyde condensates. Preferred resins of this type are those of the formula:

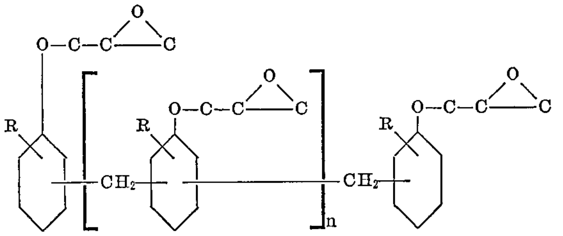

wherein R is hydrogen or an alkyl radical and *n* is an integer of 1 to about 10. Preparation of these polyepoxides is illustrated in U.S. 2,216,099 and U.S. 2,658,885.

Other examples include the epoxidized esters of the polyethylenically unsaturated monocarboxylic acids, such as epoxidized linseed, soybean, perilla, oiticica, tung, walnut and dehydrated castor oil, methyl linoleate, butyl lineolate, ethyl 9,12-octadecandienoate, butyl 9,12,15-octadecatrienoate, butyl eleostearate, mono or diglycerides of tung oil, fatty acids, monoglycerides of soybean oil, sunflower, rapeseed, hempseed, sardine, cottonseed oil, and the like.

Another group of the epoxy-containing materials used in the process of the invention include the epoxidized esters of unsaturated monohydric alcohols and polycarboxylic acids, such as, for example:

diglycidyl phthalate,
diglycidyl adipate,
diglycidyl isophthalate,
di(2,3-epoxybutyl)adipate,
di(2,3-epoxybutyl)oxalate,
di(2,3-epoxyhexyl)succinate,
di(3,4-epoxybutyl)maleate,
di(2,3-epoxyoctyl)pimelate,
di(2,3-epoxybutyl)phthalate,
di(2,3-epoxyoctyl)tetrahydrophthalate,
di(4,5-epoxydodecyl)maleate,
di(2,3-epoxybutyl)terephthalate,
di(2,3-epoxypentyl)thiodipropionate,
di(5,6-epoxytetradecyl)diphenyldicarboxylate,
di(3,4-epoxyheptyl)sulfonyldibutyrate,
tri(2,3-epoxybutyl)1,2,4-butanetricarboxylate,
di(5,6-epoxypentadecyl)tartarate,
di(4,5-epoxytetradecyl)maleate,
di(2,3-epoxybutyl)azelate,
di(3,4-epoxybutyl)citrate,
di(5,6-epoxyoctyl)cyclohexane-1,3-dicarboxylate,
di(4,5-epoxyoctadecyl)malonate.

Another group of the epoxy-containing materials include those epoxidized esters of unsaturated alcohols and unsaturated carboxylic acids, such as glycidyl glycidate, 2,3-epoxybutyl 2,4-epoxypentanoate; 3,4-epoxyhexyl, 3,4-epoxypentanoate; 3,4-epoxycyclohexyl, 3,4-epoxycyclohexyl methyl epoxycyclohexane carboxylate.

Still another group of the epoxy-containing materials include epoxidized derivatives of polyethylenically unsaturated polycarboxylic acids, such as, for example:

dimethyl 8,9,12,13-diepoxyeicosanedioate;
dibutyl 7,8,11,12-diepoxyoctadecanedioate;
dioctyl 10,11-diethyl-8,9,12,13-diepoxyeicosanedioate;
dihexyl 6,7,10,11-diepoxyhexadecanedioate;
didecyl 9-epoxyethyl-10,11-epoxyoctadecanedioate;
dibutyl 3-butyl-3,4,5,6-diepoxycyclohexane-1,2-dicarboxylate;
dicyclohexyl 3,4,5,6-diepoxycyclohexane-1,2-dicarboxylate;
dibenzyl 1,2,4,5-diepoxycyclohexane-1,2-dicarboxylate; and diethyl 5,6,10,11-diepoxyoctadecyl succinate.

Still another group comprises the epoxidized polyester obtained by reacting an unsaturated polyhydric alcohol and/or unsaturated polycarboxylic acid or anhydride groups, such as, for example, the polyester obtained by reacting 8,9,12,13-eicosanedienedioic acid with ethylene glycol, the polyester obtained by reacting diethylene glycol with 2-cyclohexene-1,4-dicarboxylic acid and the like, and mixtures thereof.

Still another group comprises the epoxidized polyethylenically unsaturated hydrocarbons, such as epoxidized 2,2-bis(2-cyclohexenyl)propane, epoxidized vinyl cyclohexene and epoxidized dimer of cyclopentadiene.

Preferred epoxy compounds are the liquid glycidyl polyethers of 2,2-bis(4-hydroxyphenyl)propane, with the so-called liquid glycidyl polyethers being especially preferred.

Organic phosphines

Preferred phosphine catalysts include the organic phosphines, i.e., compounds of the formula:

$$P(R)_3$$

wherein at least one R is an organic radical preferably a hydrocarbon radical and the other R's are hydrogen or organic radicals and preferably hydrocarbon radicals or substituted hydrocarbon radicals which may contain no more than 25 carbon atoms. Examples of the phosphines include triphenyl phosphine, tributyl phosphine, trilauryl phosphine, tricyclohexyl phosphine, trihexyl phosphine, triallyl phosphine, tridodecyl phosphine, trieicosadecyl phosphine, trichlorobutyl phosphine, triethoxybutyl phosphine, trihexenyl phosphine, trixylyl phosphine, trinaphthyl phosphine, tricyclohexenyl phosphine, tri(3,4-diethyloctyl)phosphine, trioctadecyl phosphine, dioctyldecyl phosphine, dicyclohexyl phosphine, dibutyl allyl phosphine and the like, and mixtures thereof.

Particularly preferred phosphites to be employed include the trihydrocarbyl, dihydrocarbyl and monohydrocarbyl phosphines wherein the hydrocarbyl radicals (hydrocarbon radicals) contain from 1 to 18 carbon atoms, and more particularly those wherein the hydrocarbon radicals are alkyl, cycloalkyl, alkenyl, cycloalkenyl, aryl, alkaryl, arylalkyl, and the like radicals. Coming under special consideration are the phosphines containing at least one and preferably three aromatic radicals such as phenyl.

Organic phosphonium halides

Preferred phosphonium halides are those conforming to the formula

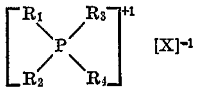

wherein X is a halogen atom, and $R_1$, $R_2$, $R_3$ and $R_4$ are the same or different and represent hydrocarbon residues which may or may not be substituted by one or more functional groups, such as halogen atoms. These phosphonium halides may generally be prepared by mixing in approximately equimolar proportions a phosphine with a halide. The mixing may be carried out with or without the application of heat, alone or in the presence of an inert solvent such as, for example, diethylether, benzene, chloroform or carbon tetrachloride.

Preferred phosphines for preparing the phosphonium halides include the organic phosphines described hereinbefore, i.e., compounds of the formula:

$$P(R)_3$$

wherein at least one R is an organic radical preferably a hydrocarbon radical and the other R's are hydrogen or organic radicals and preferably hydrocarbon radicals or substituted hydrocarbon radicals which may contain no more than 25 carbon atoms. Examples of the phosphines include triphenyl phosphine, tributyl phosphine, trilauryl phosphine, tricyclohexyl phosphine, trihexyl phosphine, triallyl phosphine, tridodecyl phosphine, trieicosadecyl phosphine, trichlorobutyl phosphine, triethoxybutyl phosphine, trihexenyl phosphine, trixylyl phosphine, trinaphthyl phosphine, tricyclohexenyl phosphine, tri(3,4-diethyloctyl)phosphine, trioctadecyl phosphine, dioctyldecyl phosphine, dicyclohexyl phosphine, dibutyl allyl phosphine and the like, and mixtures thereof.

Particularly preferred phosphines to be employed include the trihydrocarbyl, dihydrocarbyl and monohydrocarbyl phosphines wherein the hydrocarbyl radicals (hydrocarbon radicals) contain from 1 to 18 carbon atoms, and more particularly those wherein the hydrocarbon radicals are alkyl, cycloalkyl, alkenyl, cycloalkenyl, aryl, alkaryl, arylalkyl, and the like radicals. Coming under special consideration are the phosphines containing at least one and preferably three aromatic radicals such as phenyl.

Compounds to be mixed with the phosphine in the preparation of the phosphonium halide catalyst include organic halides.

Preferred organic halides are those wherein the organic radical is a hydrocarbon radical, preferably having from 1 to 10 carbon atoms. Examples of preferred organic halides include methylchloride, ethyl chloride, methyl bromide, ethyl bromide, methyl iodide, ethyl iodide, propyl iodide, n-butyl iodide, sec-butyl iodide and n-decyl iodide.

Examples of the above-noted phosphonium catalysts include, among others, methyl triphenyl phosphonium iodide, ethyl triphenyl phosphonium iodide, propyl triphenyl phosphonium iodide, n-butyl triphenyl phosphonium iodide, iso-butyl triphenyl phosphonium iodide, sec-butyl triphenyl phosphonium iodide, n-pentyl triphenyl phosphonium iodide, n-decyl triphenyl phosphonium iodide, methyl tributyl phosphonium iodide, ethyl tributyl phosphonium iodide, propyl tributyl phosphonium iodide, methyl triphenyl phosphonium chloride, ethyl triphenyl phosphonium chloride, propyl tributyl phosphonium iodide, n-butyl triphenyl phosphonium chloride and ethyl triphenyl phosphonium bromide.

To illustrate the way in which these phosphonium halide catalysts are prepared, an example is given for the preparation of ethyl triphenyl phosphonium iodide. 52 gr. of triphenyl phosphine was dissolved in 100 ml. benzene and 32 gr. of ethyl iodide was added slowly. The mixture was refluxed for 4 hours and then the white precipitate was filtered off and dried. 63 gr. of ethyl triphenyl phosphonium iodide was obtained having a melting point of 161–162° C.

In general, the phosphonium halides are preferred over the organic phosphines because of the somewhat improved shelf stability achieved.

PHENOLS

Suitable phenols used in the present process include those compounds possessing at least one OH group attached to an aromatic nucleus. The phenols may be monohydric or polyhydric and may be substituted with a great variety of different types of substituents. Examples of the phenols include, among others, phenol, resorcinol, o-cresol, m-cresol, p-cresol, carvacrol, thymol, chlorophenol, nitrophenol, dinitrophenol, picric acid, pyrocatechol, hydroquinone, pyrogallol, hydroxyhydroquinone, phloroglucinol, 2,2-bis(4-hydroxyphenyl)propane, 2,2-bis(4-hydroxyphenyl)pentane, 2,2-bis(4-hydroxyphenyl)pentanoic acid, 2,2-bis(4-hydroxyphenyl) sulfone, 2,2-bis(4-hydroxyphenyl)methane, 2-methoxy phenol, 2,4-dibutoxyphenol, 2,5-dichlorophenol, 3-acetoxyphenol, 2,2-bis(3-allyl-4-hydroxyphenyl)propane, 2,2-bis(3-isobutyl-4-hydroxyphenyl)pentane, 1,1,2,2-tetrakis(4-hydroxyphenyl)ethane, 1,1,4,4-tetrakis(4-hydroxyphenyl)pentane and the like, and polymeric type polyhydric phenols obtained by condensing monohydric or polyhydric phenols with formaldehyde, as well as phenols of the formulae

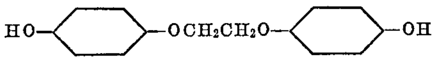

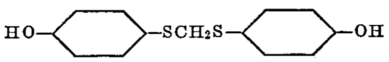

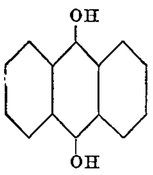

$n$ is 1 to 25

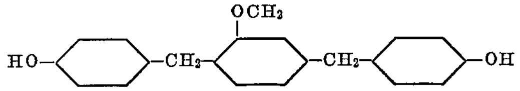

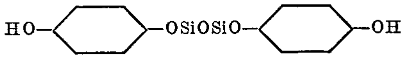

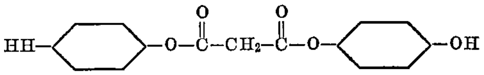

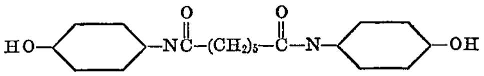

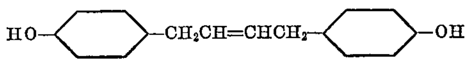

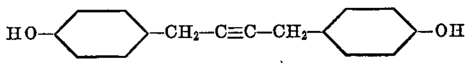

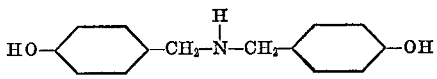

Preferred phenols to be used are the polyhydric phenols containing from 2 to 6 OH groups and up to 30 carbon atoms. Coming under special consideration are the phenols of the formula

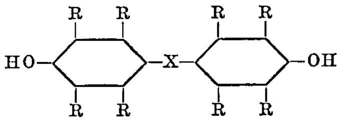

wherein X is a polyvalent element or radical and R is a member of the group consisting of hydrogen, halgen and hydrocarbon radicals. The preferred elements or radicals represented by X are oxygen, sulfur, —SO—, —$SO_2$—, bivalent hydrocarbon radicals containing up to 10 carbon atoms, and oxygen, sulfur and nitrogen-containing hydrocarbon radicals such as —ORO—, —ORORO—, —S—R—S, —S—R—S—R—S, —OSiO—, —OSiOSiO—, —O—C(=O)R—C(=O)—O—, —C(=O)—O—R—O—C(=O)—, —S(=O)—R—S(=O)—, —$SO_2$—R—$SO_2$— radicals wherein R is a bivalent hydrocarbon radical.

SOLVENTS

Preferred solvents or diluents include those which are volatile and escape from the polyepoxide composition before or during cure such as esters including ethyl acetate, butyl acetate, Cellosolve® acetate (ethylene glycol monoacetate), methyl Cellosolve® acetate (acetate thylene glycol monomethyl ether), etc.; ether alcohols, such as methyl, ethyl or butyl of ethylene glycol or diethylene glycol; chlorinated hydrocarbons such as trichloropropane, chloroform, etc. To have expense, these active solvents may be used in admixture with aromatic hydrocarbons such as benzene, toluene, xylene, etc., and/or alcohols such as methyl, ethyl, isopropyl or n-butyl alcohol, and/or ethers such as ethylene glycol monoethyl ether. Solvents which remain in the cured compositions may also be used, such as diethyl phthalate, dibutyl phthalate and the like, as well as cyano-substituted hydrocarbons, such as acetonitrile, propionitrile adiponitrile, benzonitrile, and the like. It is also convenient to employ normally liquid glycidyl compounds, glycidyl cyclopentyl ether, diglycidyl ether, glycidyl ether of glycerol and the like and mixtures thereof.

Preferred solvents include the ketones such as acetone, dimethylformamide (DMF), and methyl ethyl ketone. Of course, mixtures of solvents may be employed. In fact, when dicyandiamide was employed as the curing agent, excellent results were obtained using a 50–50 solution of DMF and water and with a 50–50 solution of acetone and methyl Cellosolve® (monomethyl ether of ethylene glycol).

The amount of solvent employed may vary considerably depending upon the desired resin pick up. Generally the amount of solvent utilized will range from 20 to 70% non-volatiles (amount of total solids other than solvent) although greater or lesser amounts may occasionally be employed. Preferred compositions contain from about 45% 70% non-volatiles.

CURING AGENTS

Suitable curing agents include materials which are acidic or alkaline.

Examples of suitable curing agents include among others, the polybasic acids and their anhydrides, such as, for example, the di, tri, and higher carboxylic acids as oxalic acid, phthalic acid, terphthalic acid, succinic acid, alkyl and alkenyl-substituted succinic acids, tartaric acid, and particularly the polymerized unsaturated acids, such as for example those containing at least 10 carbon atoms, and preferably more than 14 carbon atoms, as for instance dodecenedioic acid, 10,12-eicosadienedioic acid, and anhydrides as phthalic anhydride, succinic anhydride, maleic anhydride, Nadic Anhydride, Nadic Methyl Anhydride, pyromellitic anhydride, trimellitic anhydride and the like.

Other types of acids that are useful are those containing sulfur, N, phosphorus or halogens; chloridic acid, benzene phosphonic, sulfonyl dipropionic acid bis(4-carboxyphenyl)amide.

Other preferred curing agents include the amino-containing compounds, such as, for example, diethylene triamine, triethylene tetramine, dicyandiamide, benzoquanimine, melamine, pyridine, cyclohexylamine, benzyldimethylamine, benzylamine, diethylaniline, triethanolamine, piperidine, tetramethylpiperamine, N,N-dibutyl-1,3-propane diamine, N,N-diethyl-1,3-propane diamine, 1,2-diamino-2-methylpropane, 2,3 - diamino - 2-methylbutane, 2,3-diamino-2-methylpentane, 2,4-diamino-2,6-dimethyloctane, dibutylamine, dioctylamine, dinonylamine, distearylamine, diallylamine, dicyclohexylamine, methylethylamine, ethylcyclohexylamine, pyrrolidine, 2-methylpyrrolidine, tetrahydropyridine, 2-methylpiperidine, 2,6-dimethylpiperidine, diaminopyridine, tetramethylpentane, meta-phenylene diamine and the like, and soluble adducts of amines and polyepoxides and their salts, such as described in U.S. 2,651,589 and U.S. 2,640,037. Still other examples include the acetone soluble reaction products of polyamines and monoepoxides, the acetone soluble reaction products of polyamines with unsaturated nitriles, such as acrylonitrile, imidazoline compounds as obtained by reacting monocarboxylic acids with polyamines, sulfur and/or phosphorus-containing polyamines as obtained by reacting a mercaptan or phosphine containing active hydrogen with an epoxide halide to form a halohydrin, dehydrochlorinating and then reacting the resulting product with a polyamine, soluble reaction product of polyamines with acrylate, and many other types of reaction products of the amines.

Still other curing agents that may be used include boron trifluoride and complexes of boron trifluoride with amines, ethers, phenols and the like. Friedel-Crafts metal salts, such as aluminum chloride, zinc chloride, and other salts, such as zinc fluoborate, magnesium perchlorate and zinc fluosilicate; inorganic acids and partial esters as phosphoric acid and partial esters thereof including n-butyl orthothiophosphate, diethyl orthophosphate and hexaethyltetraphosphate and the like.

Another type of curing agent to be employed includes the polyamides containing active amino and/or carboxyl groups, and preferably those containing a plurality of amino hydrogen atoms. Examples of polybasic materials used in making these polyamides include, among others, 1,10-decanedioic acid, 1,12-dodecanedienedioic acid, 1,20-eicosadienedioic acid, 1,14-tetradecanedioic acid, 1,18-octadecanedioic acid and dimerized and trimerized fatty acids as described above. Amines used in making the polyamides include preferably the aliphatic and cycloaliphatic polyamines as ethylene diamine, diethylene triamine, triethylene tetramine, tetraethylene pentamine, 1,4-diaminobutane, 1,3-diaminobutane, hexamethylene diamine, 3-(N-isopropylamino)propylamine and the like. Especially preferred polyamides are those derived from the aliphatic polyamides containing no more than 12 carbon atoms and polymeric fatty acids obtained by dimerizing and/or trimerizing ethylenically unsaturated fatty acids containing up to 25 carbon atoms. These preferred polyamides have a viscosity between 10 and 750 poises at 40° C., and preferably 20 to 250 poises at 40° C. Preferred polyamides also have amine values of 50 to 450.

Still another group of curing agents are those based on melamine reaction products containing methylol substituents.

The amount of curing agent may vary considerably depending upon the particular agent employed. For the alkalies or phenoxides, 1% to 4% is generally suitable. With phosphoric acid and esters thereof, good results are obtained with 1 to 10% added. The tertiary amine compounds are preferably used in amounts of about 1% to 15%. The acids, anhydrides, polyamides, polyamines, polymercaptans, etc., are preferably used in at least 0.8 equivalent amounts, and preferably 0.8 to 1.5 equivalent amounts. An equivalent amount refers to that amount needed to give one active H (or anhydride group) per epoxy group.

Especially preferred curing agents include dicyandiamide, benzoguanamine, boron trifluoride monoethylamine, m-phenylenediamine, and methylenedianiline.

ACCELERATORS

Suitable accelerators (catalysts) for use in the present process include the stannous salts of monocarboxylic acids, lithium benzoate, certain heterocyclic compounds such as the imidazole and benzimidazole compounds and salts thereof, tertiary amine borates, and tertiary amines among others.

Suitable stannous salts are the stannous salts of monocarboxylic acids having at least 5 carbon atoms, preferably fatty acids containing from about 5 to about 20 carbon atoms and more preferably from about 6 to 12 carbon atoms. Preferred stannous salts are stannous caproate, stannous octoate, stannous laurate, stannous palmitate, stannous stearate, stannous oleate, and stannous naphthenate.

Suitable heterocyclic compounds possessing in the heterocyclic ring (1) a substituted C=N—C group and (2) a secondary amino group, i.e., an =N—H group, including the imidazoles, such as the substituted imidazoles and benzimidazoles having the structural formulae:

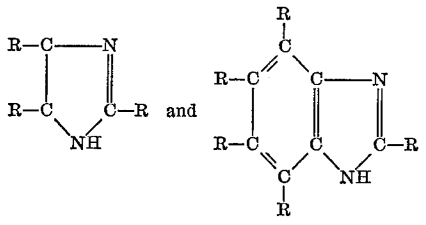

respectively, wherein R is selected from hydrogen atoms, halogen atoms, or an organic radical, such as a hydrocarbon radical or a substituted hydrocarbon radical, for example, the ester, ether, amide, imide, amino, halogen, or mercapto substituted hydrocarbon radicals. The acid portion of the salt is selected from an acid, such as phosphoric, acetic, lactice, formic, propionic and the like. Especially preferred imidazoles are those wherein the substituent is hydrogen or a hydrocarbon radical and preferably an alkyl, alkenyl, cycloalkyl, cycloalkenyl, aryl, alkaryl or arylalkyl radicals, and particularly those containing no more than 15 carbon atoms and wherein the acid is selected from monocarboxylic acids having from 1 to 8 carbon atoms, lactice, and phosphoric acids.

A more detailed description of the chemistry of the imidazoles and benzimidazoles including their properties and structural formulas is found in the book by Klaus Hofmann entitled "Imidazole and Its Derivatives" published by Interscience Publishers, Inc., New York, (1953). Examples of imidazole salts include, among others, the acetate, formate, lactate, and phosphate salts of imidazole, benzimidazole and substituted examples of suitable substituted imidazoles include: 2-methylimidazole; 2-ethyl-4-methylimidazole; 2-cyclohexyl-4-methylimidazoles; 4-butyl-5-ethylimidazole; 2-butoxy-4-allylimidazole; 2-carboethoxybutyl-4-methylimidazole; 2-octyl-4-hexylimidazole; 2-methyl-5-ethylimidazole; 2-ethyl-4-(2 - ethylamino) - imidazole; 2-methyl-4-mercaptoethylimidazole; 2,5 - chloro - 4-ethylimidazole; and mixtures thereof. Especially preferred are the alkyl-substituted imidazole acetates and lactates wherein the alkyl groups contain not more than 8 carbon atoms each, or mixtures thereof, and particularly preferred are 2-ethyl-4-methylimidazole acetate, 2-ethyl-4-methylimidazole lactate, 2-methylimidazole acetate, 2-methylimidazole lactate, imidazole acetate; imidazole lactate, and mixtures thereof.

Suitable tertiary amine borates can be prepared by reacting at room temperature a tertiary amine with a borate such as, for example, methyl borate or triethyl borate. Suitable tertiary amine borates include, among others, trimethylamine borate, triethylamine borate, triethanolamine borate, triisopropanolamine borate, benzyldimethylamine borate, alphamethylbenzyl dimethylamine borate, dimethylamino-methyl phenol borate, and tridimethyl aminomethyl phenol borate. Particularly preferred is triethanolamine borate.

The teritiary amines that may be used as catalysts are those mono- or polyamines having an open chain or cyclic structure which have all of the amine hydrogen replaced by suitable substituents, such as hydrocarbon radicals, and preferably aliphatic, cycloaliphatic or aromatic radicals. Examples of these amines include, among others, methyl diethanol amine, triethylamine, tributyl-amine, dimethyl benzylamine, triphenylamine, tricyclohexyl amine, pyridine, quinoline, and the like. Preferred amines are the trialkyl, tricycloalkyl and triaryl amines, such as triethylamine, triphenylamine, tri(2,3-dimethylcyclohexyl)amine, and the alkyl dialkanol amines, such as methyl diethanol amines and the trialkanolamines such as triethanolamine. Weak tertiary amines, e.g., amines that in aqueous solutions give a pH less than 10, are particularly preferred.

Especially preferred tertiary amine accelerators are benzyldimethylamine and tris-dimethylaminomethyl phenol (DMP-30—Rohm and Haas Company) because of the excellent results obtained when used in the present process.

The present catalysts (accelerators), if employed, are generally employed in amounts varying from about 0.01% to 5% by weight of the reactants, with from 0.05 to 3% being generally preferred.

The present invention is particularly directed to a special laminating resin formulation (varnish) which can be prepared in situ and can be conveniently and economically varied to meet specific requirements.

Simply, the formulation comprises (1) a precatalyzed polyepoxide composition comprising an epoxy compound and an organic phosphonium halide or an organic phosphine as hereinbefore described; (2) a phenol; (3) a suitable solvent; (4) an epoxy curing agent; and, optionally (5) in accelerator or catalyst.

The laminating resin is simply prepared by mixing the components together and applying the mixture to a suitable glass cloth, mesh, web or the like. Various resins can be conveniently made by simply varying the amount of phenol used for a given amount of the precatalyzed polyepoxide composition. Generally, on a weight basis the ratio of catalyzed polyepoxide composition to phenol will vary from 10:90 to 90:10; however, from 80:20 to 25:75 is preferred.

By way of example only, the following formulation produced excellent glass laminates:

(1) 70 to 80 parts by weight of a precatalyzed polyepoxide composition comprising a glycidyl polyether of 2,2-bis(4-hydroxyphenyl)-propane having an average molecular weight of from 350 to 400 containing from 0.05 to 0.25% of an organic phosphonium halide such as triphenylethyl phosphonium iodide and/or organic phosphine such as triphenyl phosphine;

(2) From 20 to 30 parts by weight of a polyhydric phenol such as 2,2-bis(4-hydroxyphenyl)propane or a halogenated phenol such as tetrabromo bisphenol A;

(3) An organic solvent such as acetone, dimethylformamide, methyl Oxitol® glycol ether, or methyl Cellosolve®, etc., in an amount to give from 50% to 65% non-volatiles;

(4) A curing amount of dicyandiamide or benzoquanimine or the like;

(5) An accelerating amount of a tertiary amine such as benzyldimethylamine.

The laminating varnish may be applied by any conventional technique such as spraying, dipping, painting and the like.

Although not necessary, it is generally desirable to "advance" the impregnated glass webs or mats according to standard techniques, temperatures and times. Convenient temperatures range from 100° to 200° C.; and convenient times range from 0.5 to 15 minutes.

The "advanced" impregnated webs, sheets, etc. (advanced prepreg) may then be fabricated into laminates by the application of appropriate heat and pressure for a predetermined time or cure schedule. Generally, pressures from about 5 p.s.i. to about 1000 p.s.i. are suitable, at temperatures from about 130° C. to about 200° C.

To illustrate the manner in which the invention may be carried out, the following examples are given. It is to be understood, however, that the examples are for the purpose of illustration only and that the invention is not to be regarded as limited to any of the specific conditions or reactants recited therein. Unless otherwise indicated, parts described in the examples are parts by weight.

EXAMPLE I

This example illustrates the preparation of the present laminating varnish and laminates prepared therefrom.

The laminating varnish was first prepared by mixing and blending the following two solutions by simple agitation in a tumbler for approximately 30 minutes:

(1) a solution containing:

| | |
|---|---|
| (a) Glycidyl polyether of 2,2-bis(4-hydroxyphenyl)propane having an average molecular weight of about 350 and an epoxide equivalent weight of about 180 containing 0.1% of triphenyl phosphonium ethyl iodide (TPPEI)-[Polyepoxide A] | 75 |
| (b) Bisphenol A, 2,2-bis(4-hydroxyphenyl)propane (BPA) | 25 |
| (c) Acetone | 20 |

and (2) a solution containing

| | |
|---|---|
| (a) dicyandiamide dissolved in methyl Oxitol® glycol ether (10% solution) | 40 |
| (b) benzyldimethylamine (BDMA) | 0.2 |

It will be appreciated that the present process is not to be restricted to a "two-solution" process, and that the "two-solution" technique is for convenience only, i.e., all the components could be added to the tumbler and agitated for an appropriate time. It will be further appreciated that the respective solutions may be prepared and stored prior to actual use. It has been found, for example, that solution (1), i.e., the polyepoxide/BPA/acetone solutions are stable for more than a week at 40°, 77° and 100° F.

The above laminating varnish was then used to impregnate HG-28 Volan A glass cloth (this is an industrial glass fabric of plain weave, electrical grade glass and containing a Volan A finish applied to the glass fabric) in a standard fashion, i.e., by dipping the HG-28 glass cloth in the varnish with the aid of a coatette (jig type) device; another method is simply to paint the laminating varnish on to the glass cloth which has been laid flat on top of a piece of Mylar or cellophane plastic sheet.

These wet prepregs containing 60% by weight varnish were then advanced in an oven at various schedules, e.g., 5 minutes at 330° F. and 30 minutes at 250° F.

The advanced prepregs were then fabricated into G-10 type electrical laminates containing 8 plies of advanced prepregs at conventional cure cycles, e.g., at 30 to 60 minutes at 350° F. and 200 p.s.i.

Various physical properties of the resulting laminates were determined and tabulated in Table I.

The above procedure was repeated wherein the laminating resin comprised an acetone solution of a polyepoxide prepared by the fusion technique wherein polyepoxide/catalyst component and BPA are prereacted in a kettle under the following conditions: The liquid polyepoxide resin and Bisphenol A are heated in a kettle to 250° to 270° F. and allowed to heat exotherm. After the exotherm has exhausted, the blend is heated at 350° F. for ½ hour. Then the resultant resin is cooled partly and cut to 80% solids with acetone.

This resin will be referred to herein as Polyepoxide X.

The above procedure was again repeated wherein the laminating resin was an acetone solution of a glycidyl polyether of 2,2-bis(4-hydroxyphenyl)propane having a molecular weight of about 900 and an epoxide equivalent weight of from about 425 to 500 (Polyepoxide Y).

The comparative results are tabulated in Table I.

TABLE I
G-10 type, 8-ply HG-28 cloth laminates

| | Advance schedule, hr./° F. | Kiss time, hr. | Press time | Flex strength, p.s.i. RT | Flex strength, p.s.i. 225° F. | Resin content | Normalized[1] flex strength, p.s.i. RT | Normalized[1] flex strength, p.s.i. 225° F. | Peel strength, lb./in. width Initial | Peel strength, lb./in. width After solder dip 1'/500° F. |
|---|---|---|---|---|---|---|---|---|---|---|
| Polyepoxide A/BPA (in situ) | 5/330 | 3 | 1 hr. | 76,200 | 23,000 | 36.0 | 82,200 | 29,000 | ------ | ------ |
| | 5/330 | 3 | 30 min. | 62,900 | 18,300 | 42.0 | 77,900 | 33,300 | 17.3 | 18.3 |
| | 30/250 | 3 | 1 hr. | 91,000 | 31,200 | ------ | ------ | ------ | 19.8 | 20.3 |
| | 10/300 | 3 | 1 hr. | 68,000 | 22,700 | 39.3 | 78,900 | 33,600 | ------ | ------ |
| | 10/300 | 3 | 30 min. | 69,600 | 19,800 | 38.5 | 79,300 | 29,500 | 17.3 | 17.8 |
| Polyepoxide X[2] | 30/250 | 4 | 1 hr. | 79,000 | 26,600 | 26.7 | 71,100 | 18,700 | 20.0 | 19.5 |
| Polyepoxide Y | 30/250 | 2 | 1 hr. | 74,200 | 13,700 | 31.5 | 73,500 | 13,000 | 18.5 | 16.8 |

[1] Normalized flex strength: Calculated by adding or subtracting 1,500 p.s.i. for each 1.0% of resin content variance from 32.0% level.
[2] Derived from kettled polyepoxide A/BPA.

EXAMPLE II

The procedures of Example I were essentially repeated wherein the bisphenol A (BPA) is replaced with an equivalent amount of tetrabromobisphenol A (TBBPA) to prepare Polyepoxide B.

Polyepoxide Z was likewise prepared by the kettle fusion of Polyepoxide A and TBBPA.

FR-4 type laminates were prepared (8 plies in HG-28 cloth) by the same techniques described in Example I using the following varnishes:

(1) Polyepoxide B (Polyepoxide A/TBBPA)—in situ preparation;
(2) Polyepoxide Z (kettle fusion technique of Polyepoxide A/TBBPA);
(3) Polyepoxide M (same as Polyepoxide Z using tetramethyl ammonium bromide catalyst).

The comparative data are tabulated in Table II.

We claim as our invention:

1. A process for preparing reinforced laminates in situ which comprises (A) impregnating a fibrous material with a composition comprising (1) a polyepoxide having more than one vicinal group containing a catalytic amount of a catalyst selected from the group consisting of organic phosphines having the general formula $P(R)_3$ wherein at least one R is a hydrocarbon radical and the other R's are hydrogen or hydrocarbon radicals and phosphonium halides of the general formula

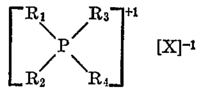

wherein X is a halogen atom and $R_1$, $R_2$, $R_3$ and $R_4$ are the same or different hydrocarbon radicals containing from 1 to 18 carbon atoms, which radicals may be substituted with halogen atoms,
(2) a phenol,
(3) a solvent, and
(4) an epoxy curing agent, and (B) curing said laminate.

2. A process as in claim 1 wherein a curing agent accelerator is additionally employed.

TABLE II
FR-4 type, 8-ply HG-28 cloth laminates

| | Advance schedule, hr./° F. | Kiss time, hr. | Press time | Flex strength, p.s.i. RT[2] | Flex strength, p.s.i. 225° F. | Resin content | Normalized[1] flex strength, p.s.i. RT[2] | Normalized[1] flex strength, p.s.i. 225° F. | Pell strength, lb./in. width Initial | Pell strength, lb./in. width After solder dip 1'/500° F. |
|---|---|---|---|---|---|---|---|---|---|---|
| Polyepoxide A/TBBA (in situ) | 10/330 | 3 | 1 hr. | 67,600 | 40,400 | 41.9 | 82,400 | 55,200 | 14.2 | 14.8 |
| | 10/330 | 3 | 30 min. | 69,300 | 28,900 | 42.9 | 85,600 | 45,200 | 15.3 | 14.3 |
| Polyepoxide Z[3] | 30/250 | 3 | 1 hr. | 90,300 | 45,200 | ------ | ------ | ------ | ------ | ------ |
| Polyepoxide M | 10/302 | 2 | 25 min. | 70,000 | 32,500 | 38.5 | 79,700 | 42,200 | 11.0 | 11.0 |

[1] Normalized flex strength: Calculated by adding or subtracting 1,500 p.s.i. for each 1.0% of resin content variance from 32.0% level.
[2] RT: 23° C., 50% relative humidity.
[3] Derived from kettled polyepoxide A/IBBPA.

EXAMPLE III

This example illustrates the dielectric properties of NEMA G-10 type laminates prepared from the in situ laminate from Polyepoxide A/BPA and from Polyepoxide Y. Laminates were prepared from these two resin systems using techniques described in Example I. The respective dielectric properties are tabulated in Table III.

TABLE III
Dielectric properties of NEMA G-10 type laminates

| | NEMA test condition | In situ laminate ex polyepoxide A/BPA | Polyepoxide Y | NEMA specification, max. |
|---|---|---|---|---|
| Dielectric constant: | | | | |
| 1 kilocycle | A | 4.27 | 4.85 | ------ |
| Do | D-24/23 | 4.39 | 4.88 | ------ |
| 1 megacycle | A | 4.06 | 4.6 | ------ |
| Do | D-24/23 | 4.09 | 4.6 | 5.4 |
| Dissipation factor: | | | | |
| 1 kilocycle | A | 0.005 | 0.006 | ------ |
| Do | D-24/23 | 0.005 | 0.006 | ------ |
| 1 megacycle | A | 0.013 | 0.026 | ------ |
| Do | D-24/23 | 0.014 | 0.027 | 0.035 |
| Water absorption | D-24/23 | 0.13 | *0.11 | 0.25 |

*Typical value.

3. A process as in claim 1 wherein the polyepoxide is a glycidyl polyether of a polyhydric phenol.

4. A process as in claim 3 wherein the polyepoxide is a glycidyl polyether of 2,2-bis(4-hydroxyphenyl)propane.

5. A process as in claim 1 wherein the phenol is a dihydric phenol.

6. A process as in claim 5 wherein the dihydric phenol is substituted with at least one halogen atom.

7. A process as in claim 1 wherein the phosphonium halide is triphenyl ethyl phosphonium iodide.

8. A process as in claim 1 wherein the amount of the phosphonium halide or organic phosphine varies from about 0.001% to about 10% by weight of the polyepoxide.

9. A process as in claim 1 wherein the solvent is an organic solvent.

10. A process as in claim 9 wherein the organic solvent is ketone.

11. A process as in claim 1 wherein the epoxy curing agent is dicyandiamide.

References Cited

UNITED STATES PATENTS

| | | | |
|---|---|---|---|
| 3,454,421 | 7/1969 | Westbrook | 260—47 |
| 3,477,990 | 11/1969 | Dante et al. | 260—47 |

WILLIAM H. SHORT, Primary Examiner

T. C. PERTILLA, Assistant Examiner

U.S. Cl. X.R.

117—161 ZB; 161—185; 260—18 PF, 47 LP, 47 LN, 47 LQ